US012811622B2

(12) United States Patent
Fikstvedt

(10) Patent No.: US 12,811,622 B2
(45) Date of Patent: Nov. 24, 2026

(54) INTEGRATED RECEIVER TRANSMITTER SWITCH

(71) Applicant: TEXAS INSTRUMENTS INCORPORATED, Dallas, TX (US)

(72) Inventor: Oddgeir Fikstvedt, Oslo (NO)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 319 days.

(21) Appl. No.: 18/392,693

(22) Filed: Dec. 21, 2023

(65) Prior Publication Data

US 2025/0211281 A1 Jun. 26, 2025

(51) Int. Cl.

| | |
|---|---|
| ***H04B 1/44*** | (2006.01) |
| ***H03F 1/22*** | (2006.01) |
| ***H03F 3/24*** | (2006.01) |
| ***H04B 1/04*** | (2006.01) |
| ***H04B 1/48*** | (2006.01) |

(52) U.S. Cl.

CPC ............... *H04B 1/48* (2013.01); *H03F 1/223* (2013.01); *H03F 3/245* (2013.01); *H04B 1/0475* (2013.01); *H03F 2200/294* (2013.01); *H03F 2200/451* (2013.01)

(58) Field of Classification Search

CPC ...... H04B 1/0014; H04B 1/0039; H04B 1/04; H04B 2001/0408; H04B 1/16; H04B 1/18; H04B 1/40; H04B 1/403; H03F 1/0205; H03F 1/0211; H03F 1/083; H03F 1/223; H03F 3/195; H03F 3/347

See application file for complete search history.

(56) References Cited

U.S. PATENT DOCUMENTS

| | | | | |
|---|---|---|---|---|
| 7,103,126 | B2 * | 9/2006 | Joo | G11C 7/106 375/354 |
| 7,420,425 | B2 * | 9/2008 | Tsai | H03F 3/193 330/311 |
| 7,843,269 | B2 * | 11/2010 | Chen | H03F 3/195 330/124 R |
| 8,711,831 | B2 * | 4/2014 | Akbari | H04B 1/48 370/347 |
| 9,374,122 | B2 * | 6/2016 | Lee | H04L 5/14 |
| 10,735,044 | B2 * | 8/2020 | Xu | H04B 1/40 |
| 2009/0140815 | A1 | 6/2009 | Cha | |
| 2009/0289721 | A1 | 11/2009 | Rajendran | |
| 2011/0063035 | A1 | 3/2011 | Park | |
| 2013/0113117 | A1 * | 5/2013 | Haralabidis | H01L 23/66 257/777 |

(Continued)

OTHER PUBLICATIONS

PCT Search Report for PCT2023/086494 dated Sep. 10, 2024.

*Primary Examiner* — Tuan Pham

(74) *Attorney, Agent, or Firm* — Michelle F. Murray; Charles Koch

(57) ABSTRACT

A communication integrated circuit (IC) device comprises a silicon substrate and a radio circuit formed on the silicon substrate. The radio circuit comprises a receive and transmit circuit that comprises a cascode amplifier and a low-noise amplifier coupled with the cascode amplifier. The radio circuit also comprises a radio frequency input/output channel configured to be coupled with a radio antenna. The communication IC device further comprises a receive modem coupled with the low-noise amplifier and a transmit modem coupled with the cascode amplifier.

20 Claims, 4 Drawing Sheets

(56) References Cited

U.S. PATENT DOCUMENTS

| | | | | |
|---|---|---|---|---|
| 2016/0142231 | A1 | 5/2016 | Rajendran | |
| 2020/0212859 | A1 | 7/2020 | Kim | |
| 2023/0291431 | A1 * | 9/2023 | Liang | H03F 1/223 |

* cited by examiner

INTEGRATED RECEIVER TRANSMITTER SWITCH

BACKGROUND

In a radio, a transmitter and receiver can be combined and connected to a single antenna to transmit (Tx) a transmission signal and to receive (Rx) a receive signal transmitted from another radio source. The combination of the transmitted signal and received signal may be accomplished by an Rx/Tx switch. In many applications, a power amplifier (PA) for signal transmission and a low noise amplifier (LNA) for signal receiving cannot be connected together due to the voltage swing on the output of the power amplifier being very large and the LNA input needing to be protected from such large signals.

The transmitter and receiver may be combined on a single common substrate such as silicon. The voltage needs of the Rx/Tx switch, however, commonly finds the Rx/Tx switch formed on an external component such as a printed circuit board (PCB) external to the single common substrate to provide satisfactory performance. While existing Rx/Tx switches can be integrated on silicon using CMOS technology, this type of construction may be quite poor. Due to the Rx/Tx switch being an external component to the single common substrate of the transmitter and receiver, separate pins may be needed for the connections of the transmitter to the PA and of the receiver to the LNA.

SUMMARY

In accordance with one aspect of the present disclosure, a communication integrated circuit (IC) device comprises a silicon substrate and a radio circuit formed on the silicon substrate. The radio circuit comprises a receive and transmit circuit comprises a cascode amplifier and a low-noise amplifier coupled with the cascode amplifier. The radio circuit also comprises a radio frequency input/output channel configured to be coupled with a radio antenna. The communication IC further comprises a receive modem coupled with the low-noise amplifier and a transmit modem coupled with the cascode amplifier.

In accordance with another aspect of the present disclosure, a receive and transmit (Rx/Tx) circuit formed on a silicon substrate comprises a first cascode amplifier that comprises a radio frequency (RF) input/output (IO) node and a first low-noise amplifier node. The RF IO node is configured to output a first transmit signal via an antenna. The Rx/Tx circuit also comprises a low-noise amplifier coupled with the first low-noise amplifier node and having a first low-noise output configured to output a first low noise signal to a first receive channel formed on the silicon substrate. The Rx/Tx circuit further comprises a first transmitter input coupled with the first cascode amplifier and configured to supply a first input signal from a first transmit channel formed on the silicon substrate to the first cascode amplifier. The first cascode amplifier is configured to generate the first transmit signal based on the first input signal.

In accordance with another aspect of the present disclosure, a radio communication circuit comprises a cascode amplifier formed on a silicon substrate that comprises a first transistor, a second transistor, an amplifier coupled with the first and second transistors, and an input coupled with the second transistor. The amplifier comprises an output. The radio communication circuit also comprises a transmit circuit formed on the silicon substrate and coupled with the input and comprises a receive circuit formed on the silicon substrate and coupled with the output.

DETAILED DESCRIPTION

In the following description, for purposes of explanation, numerous specific details are set forth in order to provide a thorough understanding of the examples disclosed herein. It will be apparent, however, to one skilled in the art that the disclosed example implementations may be practiced without these specific details. In other instances, structure and devices are shown in block diagram form in order to avoid obscuring the disclosed examples. Moreover, the language used in this disclosure has been principally selected for readability and instructional purposes and may not have been selected to delineate or circumscribe the inventive subject matter, resorting to the claims being necessary to determine such inventive subject matter. Reference in the specification to "one example" or to "an example" means that a particular feature, structure, or characteristic described in connection with the examples is included in at least one implementation.

Figure 1:
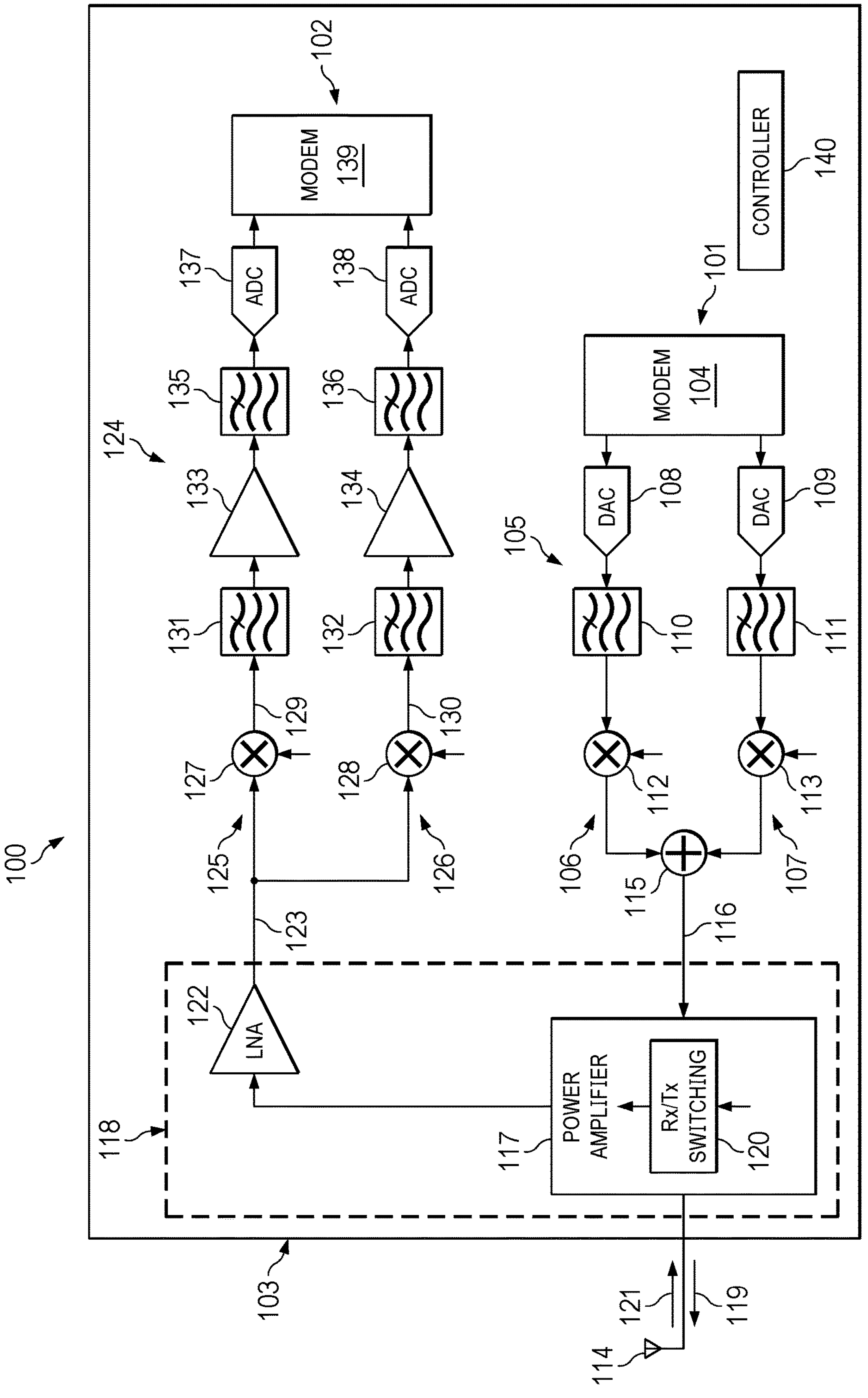
FIG. 1 is a circuit block diagram of a radio device according to one or more disclosed implementations.

FIG. 1 illustrates a circuit block diagram of a portion of a radio device or circuit 100 according to an embodiment. The radio device 100 includes a transmitter 101 forming a transmit channel or chain and includes a receiver 102 forming a receive channel or chain. Both the transmitter 101 and the receiver 102 are formed on a single, common substrate 103 such as a silicon substrate.

The transmitter 101 includes a transmit modem 104 coupled with a transmit circuit 105 having an in-phase (I) channel 106 and a quadrature (Q) channel 107. Each of the I and Q channels 106, 107 includes a digital-to-analog converter (DAC) 108, 109 coupled with the transmit modem 104 configured to convert a respective digital signal from the transmit modem 104 into an analog signal. A pair of filters 110, 111 filter the analog-converted signals and output the filtered signals to a respective mixer 112, 113. The mixers 112, 113 mix the filtered signals with high frequency signals provided by local oscillators (not shown) to increase the frequency of the filtered signals for transmission from a radio antenna 114. A summer 115 sums the high-frequency signals output from the mixers 112, 113 of the I and Q channels 106, 107 and generates an output signal 116 to be transmitted.

A power amplifier circuit 117 of a receive/transmit (Rx/Tx) circuit 118 receives the output signal 116 and generates a transmission signal 119. As illustrated in FIG. 1, the power amplifier circuit 117 performs receive/transmit (Rx/Tx) switching 120 for supplying the output signal 116 as the transmission signal 119 for radio transmission during a transmit mode as well as for supplying a received signal 121 from the radio antenna 114 to a low noise amplifier 122 of the Rx/Tx circuit 118 during a receive mode. The Rx/Tx functionality of the power amplifier circuit 117 is detailed in the embodiments of FIGS. 2 and 3 according to one or more examples.

As stated, the power amplifier circuit 117 receives the received signal 121 during the receive mode and provides the received signal 121 to the low-noise amplifier 122. The received signal 121 is typically a high-frequency signal that has a very low power level as compared with the power level of the transmission signal 119. The low-noise amplifier 122 is sensitive to low input level signals and is used to amplify the received signal 121 while attempting to keep the noise of the received signal 121 low. The amplified signal 123 is supplied to a receive circuit 124 of the receiver 102 as an input signal. An I channel 125 and a Q channel 126 of the receiver 102 include mixers 127, 128 that receive the amplified signal 123 and convert the amplified signal 123 into respective lower frequency signals. For example, the I channel 125 receives an I channel local oscillator signal for generating an I channel frequency signal 129 based on the amplified signal 123. The Q channel 126 receives a Q channel local oscillator signal for generating a Q channel frequency signal 130 based on the amplified signal 123. The I and Q channel frequency signals 129, 130 are respectively filtered by filters 131, 132, amplified by amplifiers 133, 134, filtered by filter 135, 136, and converted to digital signals by analog-to-digital controllers (ADCs) 137, 138. A receive modem 139 receives the digital signals from the ADCs for communicating the signals downstream.

A controller 140 may be coupled with the transmit and receive modems 104, 139 for controlling communications with additional systems or circuits on the silicon substrate 103 in an example. However, it is also contemplated that the transmit and receive modems 104, 139 may each have its own controller instead of or in addition to the controller 140. The controller 140 is coupled with the Rx/Tx circuit 118 for controlling the transmit and receive modes of the power amplifier circuit 117 and may also control the local oscillators coupled with mixers 112-113 and 127-128.

Figure 2:
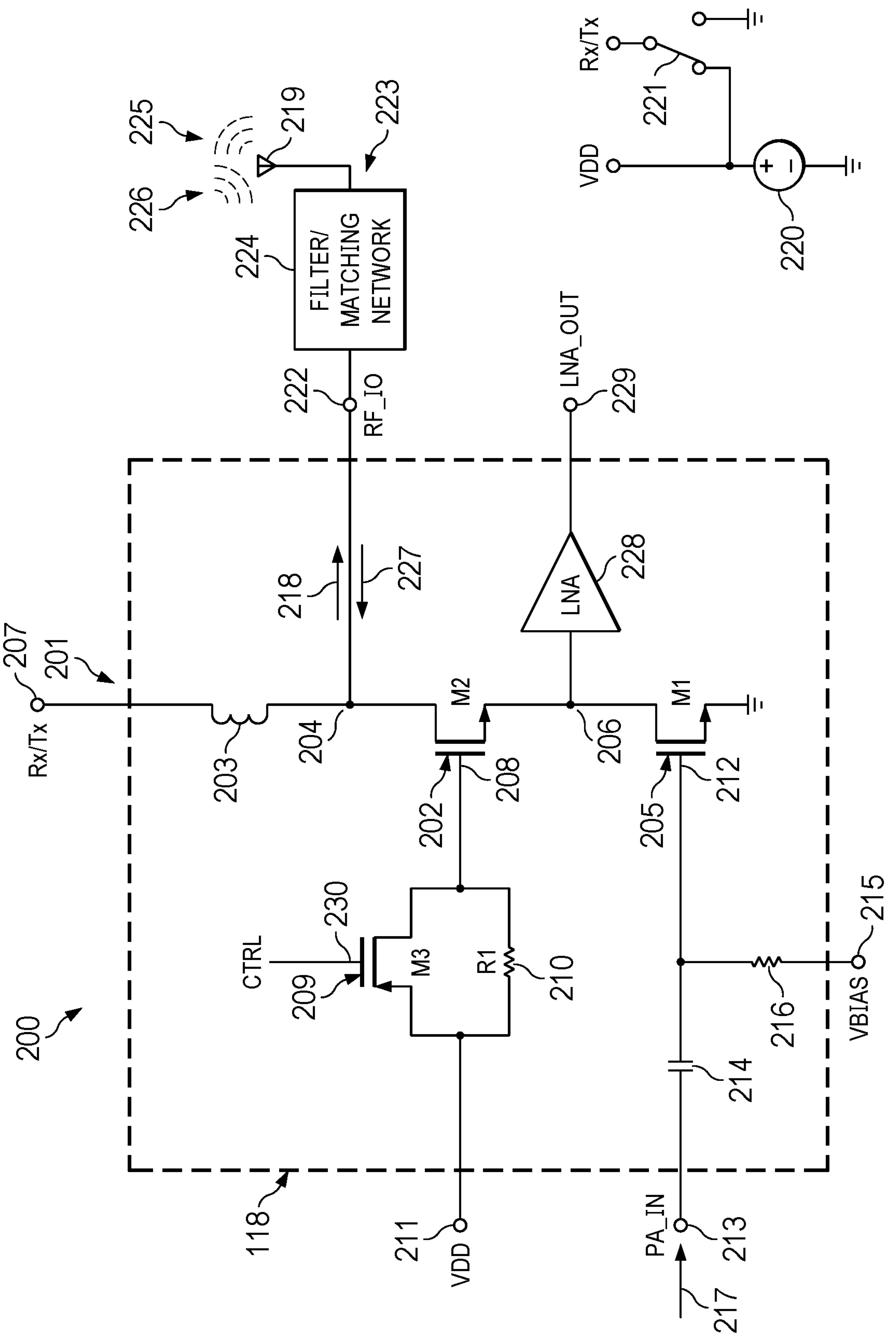
FIG. 2 is a schematic diagram of the radio device of FIG. 1 including the Rx/Tx circuit according to one or more disclosed implementations.

FIG. 2 illustrates a schematic diagram 200 of a portion of the radio device 100 of FIG. 1 including the Rx/Tx circuit 118 according to an embodiment. The Rx/Tx circuit 118 includes a cascode amplifier 201. In the embodiment shown, the cascode amplifier 201 is a cascode amplifier with an inductive load. A first transistor 202 is coupled in series with an inductor 203 via a radio frequency input/output (RF_IO) node 204 and coupled in series with a second transistor 205 via a transistor/amplifier node (e.g., a low-noise amplifier node) 206. The inductor 203 is coupled between the RF_IO node 204 and an Rx/Tx input 207. The first transistor 202 includes a gate 208 coupled in series with a parallel arrangement of a control transistor or switch 209 and a control resistor 210 and with a control voltage input 211. The second transistor 205 includes a gate 212 coupled with a power amplifier input 213 via an input capacitor 214. A voltage bias input 215 coupled with a bias resistor 216 provides a bias voltage on the gate 212.

In the transmit mode, the cascode amplifier 201 operates to convert an input transmission signal 217 (e.g., the output signal 116 from the transmitter 101 (FIG. 1)) and received at the power amplifier input 213 into an amplified transmission signal 218 (e.g., transmission signal 119 (FIG. 1)) to be sent for radio transmission by the radio antenna 219. A CMOS voltage source 220 provides a supply voltage to the control transistor 209, which is controlled into a switched-on state to provide the supply voltage to the gate 208 of the first transistor 202 with a low impedance. In one example, a switch 221 is controlled to provide the supply voltage from the CMOS voltage source 220 to the Rx/Tx input 207 as well. In another example, a distinct CMOS voltage source (not shown) may be configured to provide the supply voltage to the Rx/Tx input 207 during the transmit mode.

By supplying the supply voltage to both the gate 208 and the drain of the first transistor 202 during the transmit mode, the gate 208 and drain are at the same voltage potential, allowing the cascode amplifier 201 to amplify the input transmission signal 217 for supply to an RF_IO output 222 coupled with an RF_IO channel 223. As shown, a filter/matching network 224 of the RF_IO channel 223 is coupled between the RF_IO output 222 and the antenna 219. The amplified transmission signal 218 is transmitted from the antenna 219 as outgoing radio waves 225.

In the receive node, the cascode amplifier 201 operates to pass received low-noise radio waves 226 converted into a received signal 227 to a low-noise amplifier 228 having an amplifier output 229. The switch 221 is controlled to couple the Rx/Tx input 207 with ground. In addition, the control transistor 209 is controlled into a switched-off state that allows the control resistor 210 to provide a high impedance to the gate 208 of the first transistor 202 to allow the first transistor 202 to act as a switch. In this manner, the low-noise received signal 227 is provided, via the low-noise node 206, to the low-noise amplifier 228 for low-noise amplification and passing on to the receiver 102 (FIG. 1). Further, the second transistor 205 is turned off during the receive mode.

In one embodiment, a controller such as the controller 140 of FIG. 1 is coupled with the gate 230 of the control transistor 209 and with the switch 221 to control the transistor 209 and switch 221 during the transmit and receive modes. The controller may control the control transistor 209 into the switched-on state and the switch 221 into the supply voltage mode as described above during the transmit mode. During the receive mode, the controller may control the control transistor 209 into the switched-off state and the switch 221 into the ground mode.

Figure 3:
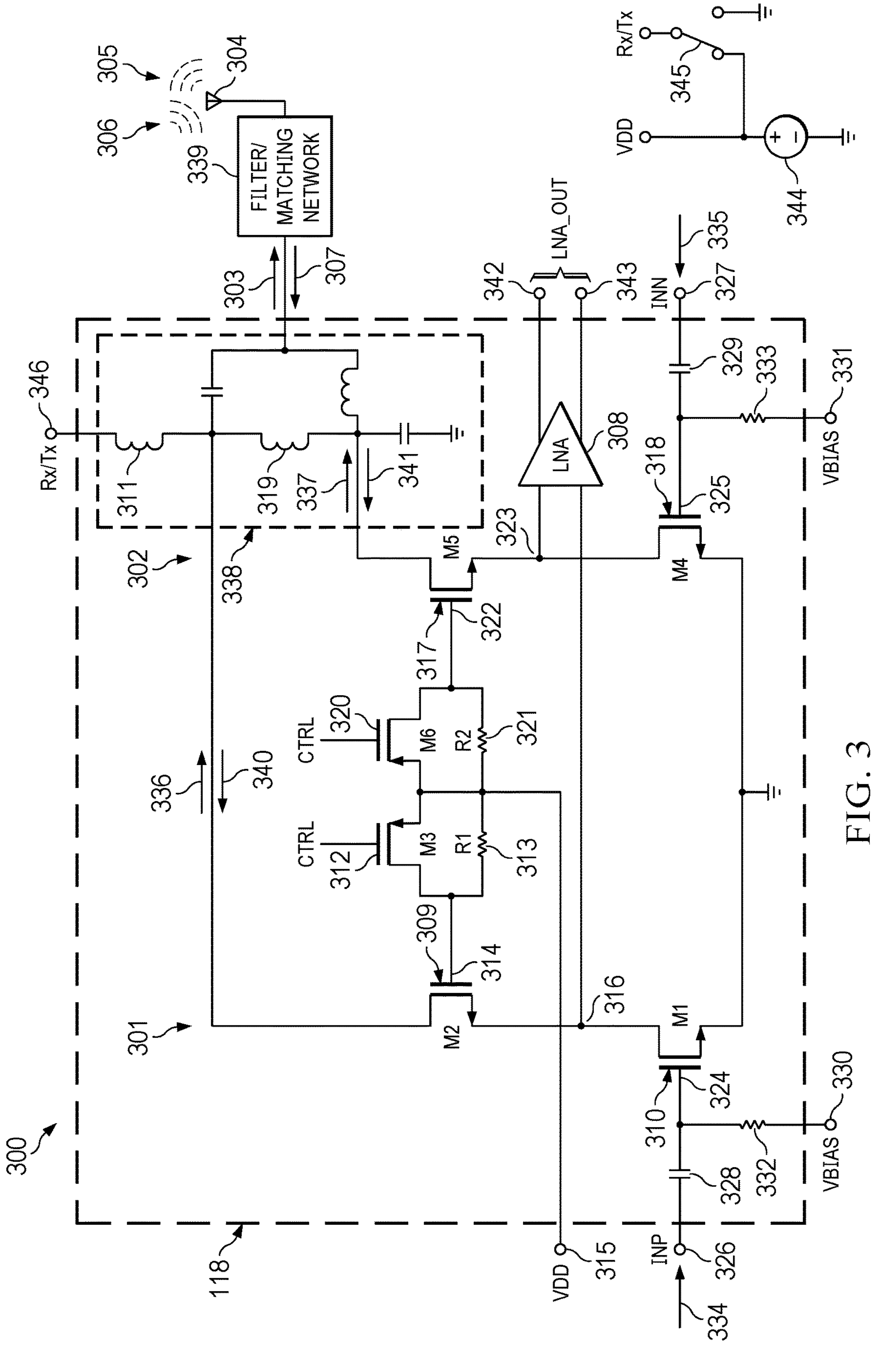
FIG. 3 is a schematic diagram of an Rx/Tx circuit of the radio device of FIG. 1 according to one or more disclosed implementations.

FIG. 3 illustrates a schematic diagram 300 of a portion of the radio device 100 of FIG. 1 including the Rx/Tx circuit 118 according to another embodiment. As shown, the Rx/Tx circuit 118 may be implemented as a differential arrangement. A first cascode amplifier 301 is coupled with a second cascode amplifier 302 for generating amplified transmission signal 303 for RF transmission from the radio antenna 304 as radio transmission signals 305 and for receiving low-noise radio waves 306 converted into a received signal 307 for delivery to a differential low-noise amplifier 308.

Similar to the cascode amplifier 201 of FIG. 2, the first cascode amplifier 301 shown in FIG. 3 is a cascode amplifier with an inductive load and includes a first transistor 309, a second transistor 310, and a first inductor 311 coupled in series. A parallel arrangement of a control transistor or switch 312 and a control resistor 313 is coupled with a gate 314 of the first transistor 309 and with a control voltage input 315. A node 316 coupling the first and second transistors 309, 310 in series is further connected to a first input of the low-noise amplifier 308.

The second cascode amplifier 302 is a cascode amplifier with an inductive load and includes a third transistor 317 and a fourth transistor 318 coupled in series with the inductive load including a second inductor 319 coupled in series with the inductor 311. A parallel arrangement of a control transistor or switch 320 and a control resistor 321 is coupled with a gate 322 of the third transistor 317 and with the control voltage input 315. A node 323 coupling the third and fourth transistors 317, 318 in series is further connected to a second input of the low-noise amplifier 308.

Each of the second and fourth transistors 310, 314 includes a gate 324, 325 coupled with a respective power amplifier input 326, 327 via a respective capacitor 328, 329. The gates 324, 325 are further coupled with a bias voltage through respective voltage bias inputs 330, 331 and bias resistor 332, 333.

In a transmit mode, power amplifier inputs 326, 327 receive first and second input transmission signals 334, 335 from a transmitter such as transmitter 101 of FIG. 1, and control transistors 312, 320 are turned on by a controller (e.g., controller 140 of FIG. 1). A CMOS voltage source 344 provides a supply voltage to the control transistors 312, 320, which, after being turned on, provide the supply voltage to the gates 314, 322 of the first and third transistors 314, 317 with a low impedance. In one example, a switch 345 is controlled to provide the supply voltage from the CMOS voltage source 344 to the Rx/Tx input 346 as well. The input transmission signals 334, 335 are accordingly amplified as transmit signals 336, 337.

A balun 338 converts a differential signal to a single-ended signal. In one example, balun 338 may be implemented as an LC balun as illustrated. However, balun 338 may be alternatively implemented as a different type of balun such as a transformer-based balun or a balun having other suitable architecture. The balun 228 converts differential transmit signals 336, 337 into the single-ended amplified transmission signal 303 that is provided to a filter/matching network 339 for RF transmission. In a receive mode, the control transistors 312, 320 are turned off by the controller, and the received signal 307 is provided as separate received signals 340, 341 by the balun 338 for inputs to the low-noise amplifier 308 via respective low-noise nodes 316, 323. A pair of low-noise amplifier outputs 342, 343 provide the received signals to a receiver such as receiver 102 of FIG. 1.

Figure 4:
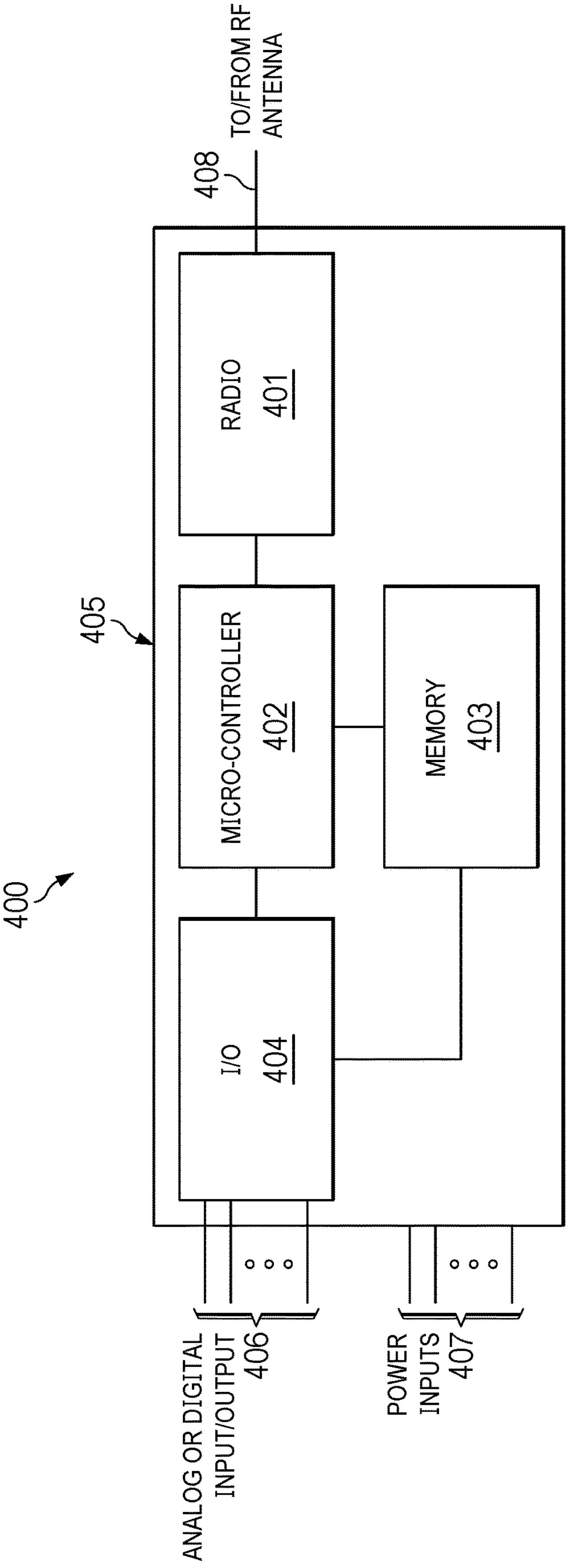
FIG. 4 is a block diagram of a radio chip according to one or more disclosed implementations.

FIG. 4 illustrates a block diagram of a radio integrated circuit (IC) or chip 400 according to an embodiment. The chip 400 incorporates a radio circuit 401, a microcontroller 402, memory 403, and input/output (IO) hardware I/O hardware 404 onto a single silicon substrate 405. In this manner, a single chip package may be formed. The radio circuit 401 is formed using one or more of the embodiments described herein, and the microcontroller 402 may be used for the operations of the controller 140. A plurality of analog and/or digital input/output pins 406 and a plurality of power input pins 407 are provided for external connections to appropriate signal and power sources. In one embodiment, the plurality of I/O pins 406 may be used for programming, operating, and communicating with the microcontroller 402 and for communicating with the memory 403. In addition, a single external antenna pin 408 is provided for connection with the antenna and a filter/matching network as illustrated herein.

In one embodiment, the transmitters, receivers, power amplifiers, low-noise amplifiers, and all other components described herein as being form on a same silicon substrate (e.g., silicon substrate 103 illustrated in FIG. 1) are complementary metal-oxide-semiconductor (CMOS) components fabricated according to CMOS fabrication techniques into a single CMOS chip. This disclosure provides an improvement to existing technology by using the disclosed power amplifier and one or more components thereof in both the transmit mode and the receive mode. Embodiments are described that provide an integrated solution for CMOS-generated RF transmit and receive signals without requiring a separate transmit/receive board. Further, as the RF signal transmit/receive switch is internal to the chip, only one external pin on the radio device for connecting the radio chip to an antenna for radio communication is needed.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

The invention claimed is:

1. A communication integrated circuit (IC) device comprising:

a silicon substrate; and a radio circuit formed on the silicon substrate and comprising:

a receive and transmit (Rx/Tx) circuit comprising:

a first cascode amplifier comprising a first transistor, a second transistor, a third transistor, and a first resistor, wherein the first resistor has a first terminal coupled to a control terminal of the second transistor and coupled to a first current terminal of the third transistor, and wherein the first resistor has a second terminal coupled to a second current terminal of the third transistor;

a second cascode amplifier comprising a fourth transistor, a fifth transistor, a sixth transistor, and a second resistor, wherein the second resistor has a first terminal coupled to a control terminal of the fifth transistor and coupled to a first current terminal of the sixth transistor, and wherein the second resistor has a second terminal coupled to a second current terminal of the sixth transistor;

a control voltage input coupled to the second terminal of the first resistor and coupled to the second terminal of the second resistor;

a low-noise amplifier coupled with the first cascode amplifier and the second cascode amplifier;

a radio frequency (RF) input/output (IO) channel configured to be coupled with a radio antenna;

a receive modem coupled with the low-noise amplifier; and a transmit modem coupled with the first cascode amplifier and the second cascode amplifier.

2. The communication IC device of claim 1, wherein the first transistor is coupled with the second transistor via a first node, and wherein the low-noise amplifier includes a first input coupled with the first node.

3. The communication IC device of claim 2, wherein the transmit modem is coupled with a control terminal of the first transistor and a control terminal of the fourth transistor.

4. A receive and transmit (Rx/Tx) circuit formed on a silicon substrate and comprising:

a first cascode amplifier comprising:

a radio frequency (RF) input/output (IO) node configured to output a first transmit signal via an antenna;

a first transistor and a second transistor coupled in series with a first inductor;

a third transistor coupled in parallel with a first resistor, wherein the third transistor and the first resistor are coupled between a control voltage and a gate of the first transistor; and a first low-noise amplifier node;

a low-noise amplifier coupled with the first low-noise amplifier node and having a first low-noise output configured to output a first low noise signal to a first receive channel formed on the silicon substrate; and a first transmitter input coupled with the first cascode amplifier and configured to supply a first input signal from a first transmit channel formed on the silicon substrate to the first cascode amplifier;

wherein the first cascode amplifier is configured to generate the first transmit signal based on the first input signal.

5. The Rx/Tx circuit of claim 4, wherein the first inductor and the first transistor are coupled in series via the RF IO node; and wherein the first transistor and the second transistor are coupled in series via the first low-noise amplifier node.

6. The Rx/Tx circuit of claim 4 further comprising:

a second cascode amplifier configured to output a second transmit signal via the antenna and comprising a second low-noise amplifier node; and a second transmitter input coupled with the second cascode amplifier and configured to supply a second input signal from a second transmit channel formed on the silicon substrate to the second cascode amplifier;

wherein the low-noise amplifier is further coupled with the second low-noise amplifier node and has a second low-noise output configured to output a second low noise signal to a second receive channel formed on the silicon substrate.

7. The Rx/Tx circuit of claim 6, wherein the second cascode amplifier further comprises a second inductor coupled in series with the first inductor, with a fourth transistor, and with a fifth transistor; and wherein the second low-noise amplifier node is coupled between the fourth transistor and the fifth transistor.

8. The Rx/Tx circuit of claim 7 further comprising a control transistor coupled in parallel with a second resistor; and wherein the control transistor and the second resistor are coupled between the control voltage and a gate of the third transistor.

9. The Rx/Tx circuit of claim 4, wherein the first transmitter input is coupled in series with a capacitor and with a gate of the second transistor.

10. A radio communication circuit comprising:

a first cascode amplifier formed on a silicon substrate and comprising:

a first transistor; and a second transistor;

a second cascode amplifier formed on the silicon substrate and comprising:

a third transistor;

a fourth transistor; and a transmit circuit formed on the silicon substrate and coupled with a control terminal of the second transistor and a control terminal of the fourth transistor;

an amplifier having a first input coupled in series between the first transistor and the second transistor, and a second input coupled in series between the third transistor and the fourth transistor; and a receive circuit formed on the silicon substrate and coupled with a first output and a second output of the amplifier.

11. The radio communication circuit of claim 10, wherein the first cascode amplifier further comprises an inductor coupled in series with the first transistor via a radio frequency (RF) input/output (IO) node; and wherein the RF IO node is configured to be coupled with a radio antenna.

12. The radio communication circuit of claim 11 further comprising a controller coupled with the transmit circuit and configured to control the transmit circuit to transmit an input signal to cause the RF IO node to output a transmission signal via the radio antenna.

13. The radio communication circuit of claim 12, wherein the controller is further coupled with the receive circuit and configured to control the receive circuit to receive a transmitted signal from the radio antenna.

14. The Rx/Tx circuit of claim 4, wherein the first inductor is coupled to a receive and transmit (Rx/Tx) input, wherein a switch is configured to couple the Rx/Tx input to a supply voltage when the Rx/Tx circuit is in a transmit mode, and wherein the switch is configured to couple the Rx/Tx input to ground when the Rx/Tx circuit is in a receive mode.

15. The radio communication circuit of claim 10, wherein the transmit circuit is coupled to the second transistor and the fourth transistor by way of a first capacitor and a second capacitor respectively, and wherein a control terminal of the second transistor and a control terminal of the fourth transistor are coupled to a bias voltage.

16. The radio communication circuit of claim 10, further comprising:

a first control transistor coupled in parallel with a first control resistor, wherein the first control transistor and the first control resistor are coupled between a control voltage and a gate of the first transistor; and a second control transistor coupled in parallel with a second control resistor, wherein the second control transistor and the second control resistor are coupled between the control voltage and a gate of the second transistor.

17. The communication IC device of claim 1, wherein the second current terminal of the third transistor is coupled to the second current terminal of the sixth transistor.

18. The communication IC device of claim 17, wherein the controller is configured to provide a supply voltage to the control terminal of the second transistor and the control terminal of the fifth transistor when in a transmit mode.

19. The communication IC device of claim 1, wherein a control terminal of the third transistor and a control terminal of the sixth transistor are connected to a controller.

20. The communication IC device of claim 2, wherein the fourth transistor is coupled with the fifth transistor via a second node, and wherein the low-noise amplifier includes a second input coupled with the second node.

* * * * *